(12) United States Patent
Kuo et al.

(10) Patent No.: US 8,456,207 B1
(45) Date of Patent: Jun. 4, 2013

(54) LOCK DETECTOR AND METHOD OF DETECTING LOCK STATUS FOR PHASE LOCK LOOP

(75) Inventors: Feng Wei Kuo, Zhudong Township (TW); Kyle Yen, Kaohsiung (TW); Huan-Neng Chen, Taichung (TW); Yen-Jen Chen, Taipei (TW); Chewn-Pu Jou, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/297,658

(22) Filed: Nov. 16, 2011

(51) Int. Cl.
*H03L 7/06* (2006.01)

(52) U.S. Cl.
USPC .......................................... 327/156; 327/147

(58) Field of Classification Search
USPC .................................. 327/147, 156
See application file for complete search history.

(56) References Cited

U.S. PATENT DOCUMENTS

| | | | |
|---|---|---|---|
| 7,916,820 B2 * | 3/2011 | Cranford et al. | 375/357 |
| 8,076,979 B2 * | 12/2011 | Kathuria et al. | 331/1 R |
| 8,130,891 B2 * | 3/2012 | Kim et al. | 375/375 |
| 2003/0007585 A1 | 1/2003 | Dalton et al. | |
| 2005/0226357 A1 * | 10/2005 | Yoshimura | 375/376 |
| 2009/0251226 A1 * | 10/2009 | Kathuria et al. | 331/1 R |

OTHER PUBLICATIONS

Melikyan, Vazgen et al., "Digital Lock Detector for Phase Locked Loop", pp. 1-2.

* cited by examiner

*Primary Examiner* — Adam Houston
(74) *Attorney, Agent, or Firm* — Lowe Hauptman Ham & Berner, LLP

(57) ABSTRACT

A lock detector for a PLL circuit includes a first signal counting circuit, a second signal counting circuit, a comparator, and a lock status unit. The first signal counting circuit is configured to define a plurality of observation periods according to a first oscillating signal and a predetermined cycle value. The second signal counting circuit is configured to determine a maximum counter value according to a second oscillating signal within each of the observation periods, and the second oscillating signal is generated in relation to the first oscillating signal. The comparator is configured to determine, for each of the observation periods, whether the maximum counter value equals the predetermined cycle value. The lock status unit is configured to generate a lock signal based on the maximum counter value being equal to the predetermined cycle value for a predetermined number of consecutive ones of the observation periods.

20 Claims, 3 Drawing Sheets

LOCK DETECTOR AND METHOD OF DETECTING LOCK STATUS FOR PHASE LOCK LOOP

BACKGROUND

A Phase Locked Loop (PLL) is an electrical circuit usable to generate a synthesized oscillating signal that matches a reference signal. The synthesized oscillating signal is considered to be "locked" with the reference signal when the frequency and/or phase of the synthesized oscillating signal and that of the reference signal are substantially the same. In some applications, such as in a radio frequency synthesizer circuit, the frequency of the synthesized oscillating signal is so high that direct comparison of the synthesized oscillating signal and the reference signal is technically and/or economically infeasible. Under these circumstances, a divider or a prescaler may be used to generate a pre-scaled feedback signal obtained by dividing the synthesized oscillating signal by a factor N. The pre-scaled feedback signal is a "snap shot" of the synthesized oscillating signal having a frequency which is 1/N of that of the synthesized oscillating signal. The synthesized oscillating signal is then considered to be "locked" with the reference signal when the frequency and/or phase of the pre-scaled feedback signal and that of the reference signal are substantially the same.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
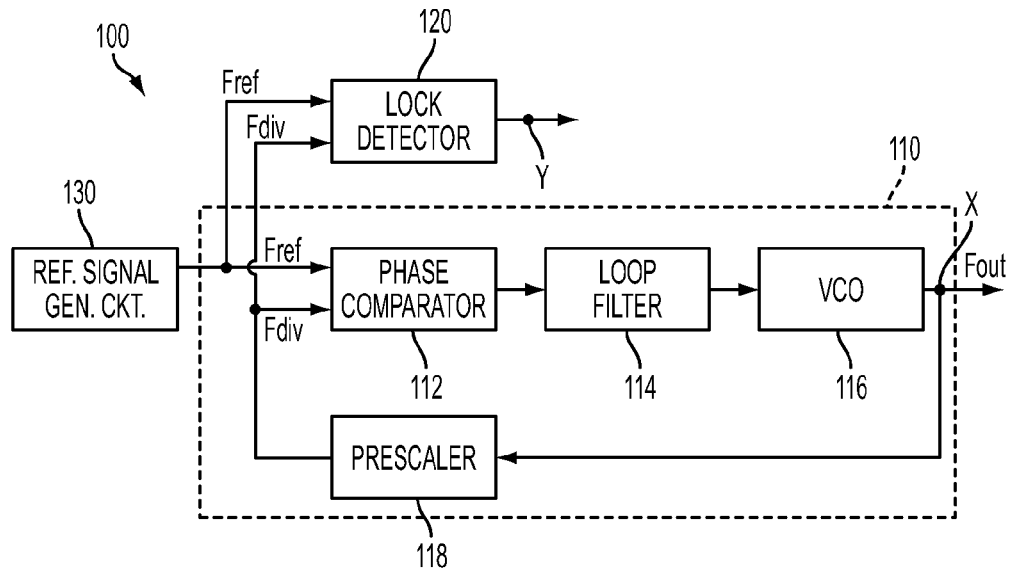
FIG. 1 is a functional block diagram of a PLL based frequency synthesizer circuit having a PLL circuit and a PLL lock detector in accordance with some embodiments.

It is understood that the following disclosure provides many different embodiments, or examples, for implementing different features of the disclosure. Specific examples of components and arrangements are described below to simplify the present disclosure. These are merely examples and are not intended to be limiting. In accordance with the standard practice in the industry, various features in the drawings may not be drawn to scale and are used for illustration purposes. The present disclosure may repeat reference numerals and/or letters in the various examples. This repetition is for the purpose of simplicity and clarity and does not in itself dictate a relationship between the various embodiments and/or configurations discussed.

In an integrated circuit (IC), a PLL based frequency synthesizer circuit works in conjunction with one or more other analog/digital electrical circuits of the IC, such as Analog-to-Digital converters, Digital-to-Analog converters, coder/encoders, and/or digital processors. In some embodiments, one or more analog/digital electrical circuits of the IC rely on a lock status of the PLL circuit in order to selectively turn on/off various sub-circuits and/or to assist the execution of a software/firmware program.

FIG. 1 is a functional block diagram of a PLL based frequency synthesizer circuit 100 having a PLL circuit 110 and a PLL lock detector 120 connected with the PLL circuit 110 in accordance with some embodiments. The PLL circuit 110 is connected to a reference signal generation circuit 130 to receive a reference signal Fref. The PLL circuit 110 outputs a synthesized oscillating signal Fout at an output node X based on the reference signal Fref. In some embodiments, the reference signal Fref is an oscillating signal having a square wave shape or a sinusoidal wave shape. In some embodiments, the synthesized oscillating signal Fout has a square wave shape or a sinusoidal wave shape.

The PLL circuit 110 also generates a pre-scaled feedback signal Fdiv, which is obtained by dividing the synthesized oscillating signal Fout at the output node X by a factor N. The PLL lock detector 120 is connected with the PLL circuit 110 to receive the reference signal Fref and the pre-scaled feedback signal Fdiv. The PLL lock detector 120 generates, at a lock signal output node Y, a lock signal indicating a lock status of the PLL circuit 110 based on the reference signal Fref and the pre-scaled feedback signal Fdiv. In some embodiments, the PLL lock detector 120 is also connected with the reference signal generation circuit 130 and receives the reference signal Fref directly from the reference signal generation circuit 130.

The PLL circuit 110 includes a phase comparison unit 112, a loop filter 114, a voltage-controlled oscillator (VCO) 116, and a prescaler 118. The phase comparison unit 112 is connected with the reference signal generation circuit 130 to receive the reference signal Fref from the reference signal generation circuit 130. The phase comparison unit 112 is also connected with the prescaler 118 to receive the pre-scaled feedback signal Fdiv and generates a phase comparison output signal for controlling the VCO 116. In the embodiment depicted in FIG. 1, loop filter 114 is connected between the phase comparison unit 112 and the VCO 116 and generates a VCO control signal by removing higher frequency components in the phase comparison output signal received from the phase comparison unit 112. The VCO 116 generates the synthesized oscillating signal Fout at node X in responsive to the VCO control signal received from the loop filter 114.

The prescaler 118 is connected between node X and the phase comparison unit 112. The prescaler 118 receives the synthesized oscillating signal Fout from the VCO 118 and generates the pre-scaled feedback signal Fdiv by dividing the synthesized oscillating signal Fout by a factor N. In some embodiments, the factor N is a positive real number. In some embodiments, the factor N is adjustable in responsive to an external control signal.

Figure 2:
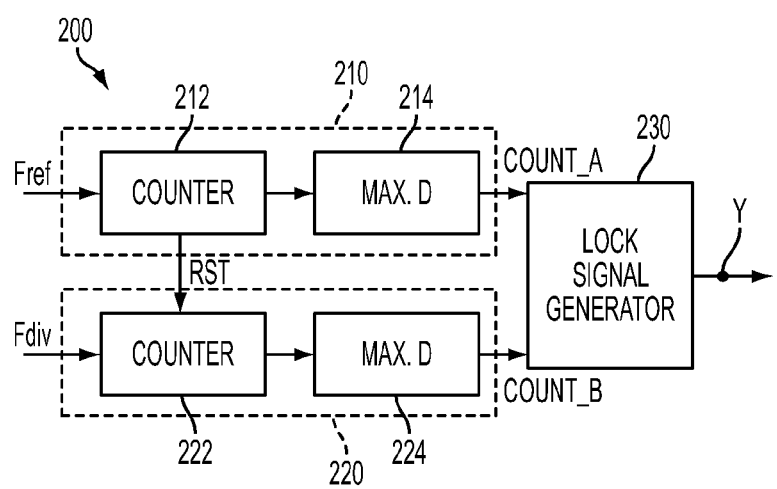
FIG. 2 is a functional block diagram of a PLL lock detector in accordance with some embodiments.

FIG. 2 is a functional block diagram of a PLL lock detector 200 in accordance with some embodiments. The PLL lock detector 200 is suitable for the application of the PLL lock detector 120 depicted in FIG. 1. In some embodiments, other implementations are within the scope of the disclosure.

PLL lock detector 200 includes a first signal counting circuit 210, a second signal counting circuit 220, and a lock signal generator 230 connected with the first signal counting circuit 210 and the second signal counting circuit 220. The first signal counting circuit 210 is connected to the PLL circuit 110 or the reference signal generation circuit 130 to receive the reference signal Fref and to generate a first maximum counter value COUNT_A by performing a counting operation based on the reference signal Fref. In some embodiments, the counting of the reference signal Fref is based on counting occurrence of a rising edge, a falling edge, or both rising and falling edges of the reference signal Fref. The first maximum counter value COUNT_A is usable for defining observation periods for the lock detector 120. In some embodiments, each observation period is defined as a period that the first maximum value COUNT_A is incremented from 0 to a predetermined cycle value.

The second signal counting circuit 220 is connected with the PLL circuit 110 to receive the pre-scaled feedback signal Fdiv. In some embodiments where the prescaler 118 is omitted, the second signal counting circuit 220 is connected with the node X to receive the synthesized oscillating signal Fout. The second signal counting circuit 220 generates a second maximum counter value COUNT_B by performing a counting operation based on the pre-scaled feedback signal Fdiv. In some embodiments, the counting of the pre-scaled feedback signal Fdiv is based on counting occurrence of a rising edge, a falling edge, or both rising and falling edges of the pre-scaled feedback signal Fdiv. In at least one embodiment, the counting of the reference signal Fref and the pre-scaled feedback signal Fdiv are based on the same approach (i.e., both counting circuits 210 and 220 rely upon a rising edge, a falling edge, or both falling and rising edges of signals).

The lock signal generator 230 is coupled with the first and second signal counting circuits 210 and 220 to receive output maximum counter values COUNT_A and COUNT_B. In at least one embodiment, a lock signal is generated at node Y after it is determined that the maximum counter value COUNT_B is equal to the predetermined cycle value, which is represented by the maximum value COUNT_A, for a predetermined number of consecutive observation periods defined by the maximum value COUNT_A and the predetermined cycle value.

The first signal counting circuit 210 has a counter 212 and a maximum detector 214. The counter 212 is connected with the PLL circuit 110 or the reference signal generation circuit 130 to receive the reference signal Fref, and the maximum detector 214 is connected with the counter 212. The counter 212 receives the reference signal Fref and generates a counter value in response to the reference signal Fref. The maximum detector 214 coupled with the counter 212 and is capable of determining a maximum counter value COUNT_A of the counter value from the counter 212. In some embodiments, the first signal counting circuit 210 defines the observation periods by performing a counting operation based on the received reference signal Fref and determining if a counted number of the reference signal Fref is equal to or greater than the predetermined cycle value. In some embodiments, the counter 212 is configured to overflow after the counted number of the counter 212 is equal to the predetermined cycle value, and the counter 212 resets the counter value of counter 212 when the counter 212 overflows. The maximum detector 214 is capable of retaining the maximum counter value COUNT_A for the lock signal generator 230 even after the counter 212 overflows.

In some embodiments, the predetermined cycle value is stored in the first signal counting circuit 210 and is less than a value that would cause the counter 212 to overflow. In these embodiments, the current counter value of counter 212 is used as the maximum counter value COUNT_A, and the maximum detector 214 is replaced with a logic unit to determine if the current counter value of the counter 212 equals the predetermined cycle value. In at least one embodiment, the predetermined cycle value stored in the first signal counting circuit 210 is adjustable in response to an external signal or command. In at least one embodiment, the maximum detector 214 is omitted, and the determination of whether the counted maximum counter value COUNT_A of the reference signal Fref is equal to or greater than the predetermined cycle value is performed by the lock signal generator 230 based on the counter value of the counter 212, which is now used as the maximum counter value COUNT_A.

The predetermined cycle value is set to be large enough to provide an accurate comparison result regarding the phases of the reference signal Fref and the pre-scaled feedback signal Fdiv, but small enough to ensure a quick determination of the lock status. In some embodiments, the predetermined cycle value is 4, 8, 16, or 20.

The second signal counting circuit 220 has a counter 222 and a maximum detector 224. The counter 222 is connected with the PLL circuit 110 to receive the pre-scaled feedback signal Fdiv, and a maximum detector 224 is connected with the counter 222. The counter 222 receives the pre-scaled feedback signal Fdiv and generates a counter value in response to the pre-scaled feedback signal Fdiv. The maximum detector 224 coupled with the counter 222 and is capable of determining a maximum counter value COUNT_B of the counter value from the counter 222. In some embodiments, the maximum detector 224 is omitted, and the counter value of counter 222 is used as the maximum counter value COUNT_B.

In some embodiments, the maximum detectors 214 and 224 are reset after the lock signal generator 230 processed the maximum counter value COUNT_A and COUNT_B. In some embodiments, the counters 212 and 222 are reset in response to the overflow of the counter 212. In some embodiments, a logic unit, which is a part of the first signal counting circuit 210 or the lock signal generator 230, that is capable of determining if the maximum counter value COUNT_A equals the predetermined cycle value is responsible for resetting both counters 212 and 222 after the maximum counter value COUNT_A is equal to the predetermined cycle value.

Figure 3:
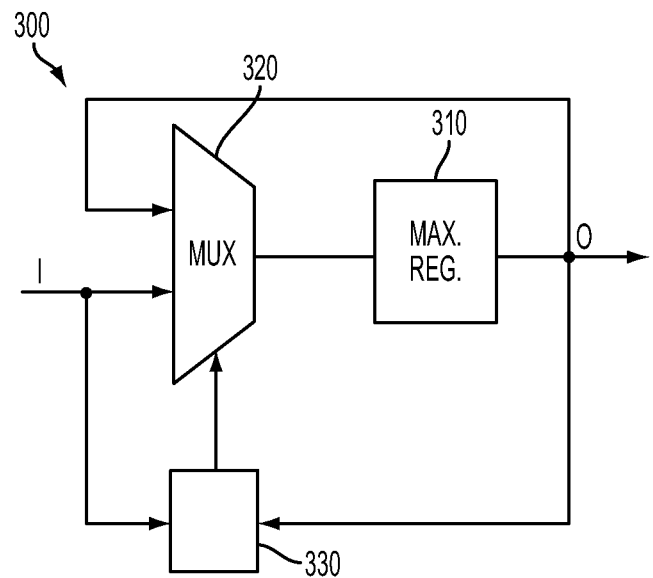
FIG. 3 is a functional block diagram of a maximum detector in accordance with some embodiments.

FIG. 3 is a functional block diagram of a maximum detector 300 in accordance with some embodiments. The maximum detector 300 is suitable for the application of the maximum detectors 214 or 224 depicted in FIG. 2. In some embodiments, other implementations are within the scope of the disclosure.

The maximum detector 300 has a maximum register 310 having an output node O, a multiplexer 320 connected to the maximum register 310 and an input node I, and a control unit 330 connected to the multiplexer 320, the input node I, and the maximum register 310 at the output node O. The maximum register 310 stores and output a stored maximum value at node O. The multiplexer 320 receives a counter value from, for example, the counter 212 or the counter 222 depicted in FIG. 2, at node I and the stored maximum value from the maximum register 320. The control unit 330 also receives the counter value and the stored maximum value from the maximum register 320. The control unit 330 compares the received counter value and the stored maximum value in order to generate a control signal to operate the multiplexer 320. In some embodiments, if the received counter value is equal to or greater than the stored maximum value, the control unit 330 instructs the multiplexer 320 to pass the received counter value to the maximum register 310; otherwise, the control unit 330 instructs the multiplexer 320 to pass the stored maximum value to the maximum register 310. The maximum register 310 then updates the stored maximum value based on the output value from the multiplexer 320 at node O.

Figure 4:
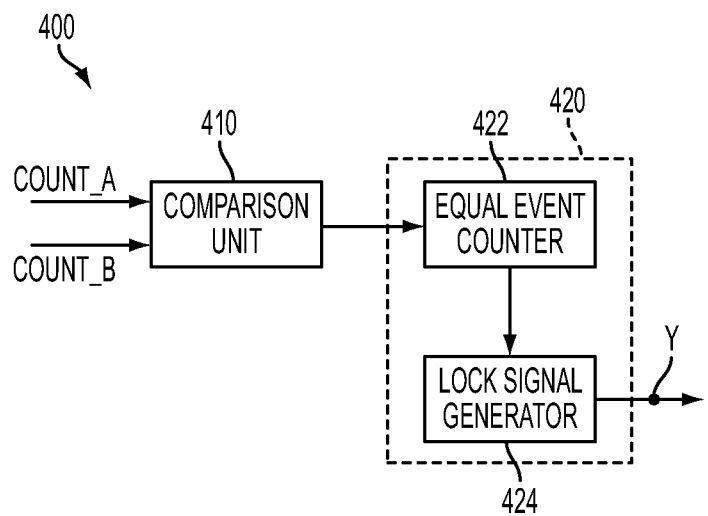
FIG. 4 is a functional block diagram of a lock signal generator in accordance with some embodiments.

FIG. 4 is a functional block diagram of a lock signal generator 400 in accordance with some embodiments. The lock signal generator 400 is suitable for the application of the lock signal generator 230 depicted in FIG. 2.

The lock signal generator 400 includes a comparison unit 410 connected to the first and second signal counting circuits 210 and 220 and a lock status unit 420 connected between the comparison unit 410 and the node Y. The comparison unit 410 determines, for the at least one observation period defined by the first signal counting circuit 210 and the predetermined cycle value, whether the maximum counter value COUNT_B from the second signal counting circuit 220 equals the predetermined cycle value, which is represented by the maximum counter value COUNT_A from the first signal counting circuit 210. In at least one embodiment, the comparison unit 410 is a comparator that receives the maximum counter values COUNT_A and COUNT_B from the first and second signal counting circuits 210 and 220, and the comparator generates an equal event or an unequal event by comparing the received maximum counter values COUNT_A and COUNT_B.

The lock status unit 420 generates a lock signal based on the comparison between the maximum counter value COUNT_B from the second signal counting circuit 220 and the predetermined cycle value. In at least one embodiment, the lock status unit 420 has an equal event counter 422 connected with the comparison unit 410 and a lock signal generator 424 connected between the equal event counter 422 and node Y. The equal event counter 422 generates an equal event counter value in response to the equal event from the comparison unit 410, and the lock signal generator 424 generates a lock signal after the equal event counter value from the equal event counter 422 is equal to a predetermined threshold counter value. For example, the lock signal generator 424 generates the lock signal after, for each of a predetermined number of consecutive observation periods defined by the first signal counting circuit 210, the maximum counter value COUNT_B equals the predetermined cycle value as represented by the maximum counter value COUNT_A. In some embodiments, the equal event counter 422 is reset after the generation of the unequal event.

The predetermined threshold counter value is set to be large enough to avoid generating the lock signal prematurely, but small enough to timely reflect that the synthesized oscillating signal Fout has been stably locked with the reference signal Fref. In at least one embodiment, the predetermined threshold counter value is 10. In some embodiments, the predetermined threshold counter value is adjustably stored in the lock status unit 424 or in a storage unit accessible to the lock status unit 424. In some embodiments, the equal event counter 422 is configured to overflow after the equal event counter value is equal to the predetermined threshold counter value, the lock signal at node Y is an overflow signal from the equal event counter 422, and the lock signal generator 424 is omitted.

Figure 5:
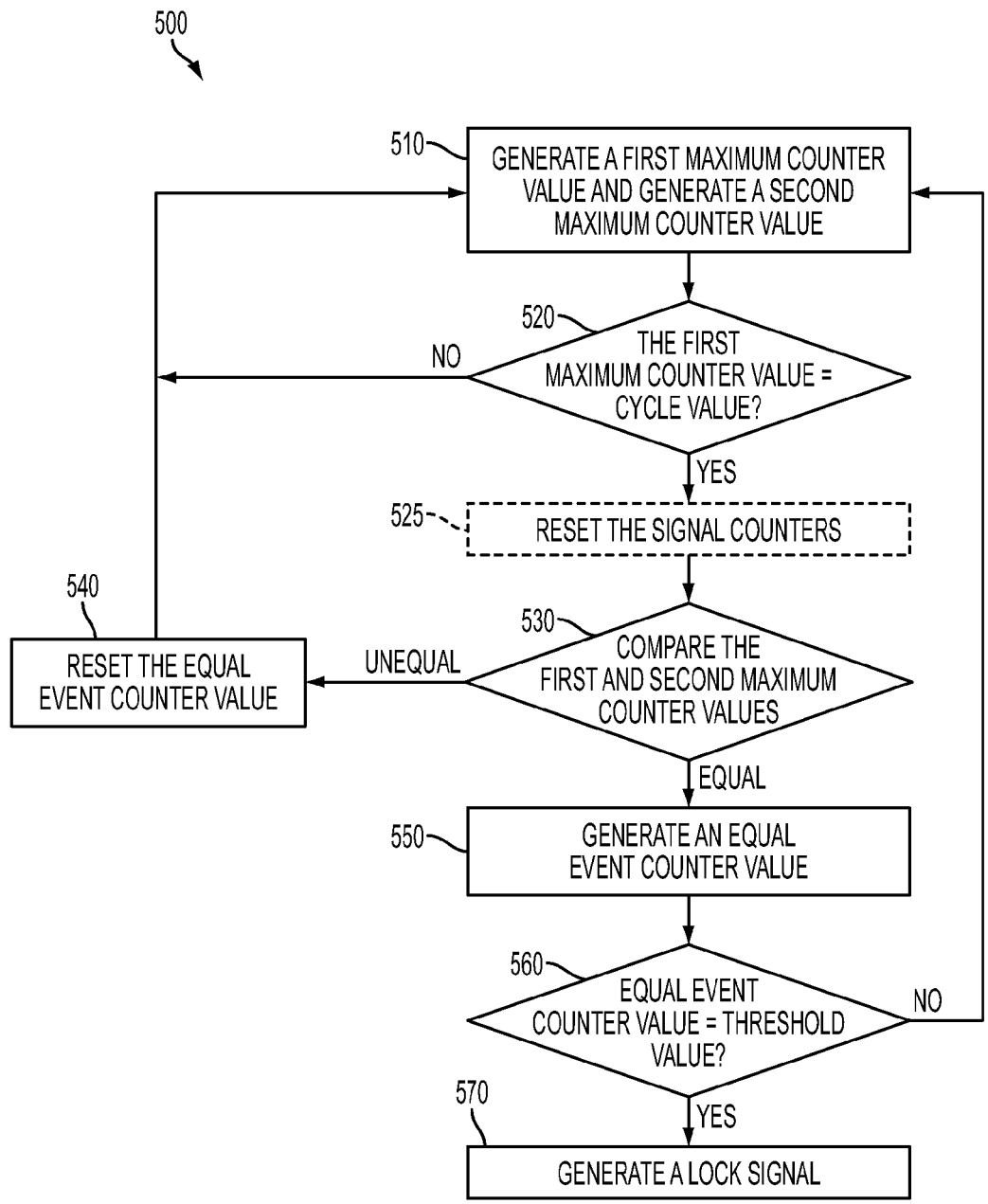
FIG. 5 is a flow chart of a method of generating a lock signal in accordance with some embodiments.

FIG. 5 is a flow chart of a method 500 of generating a lock signal in accordance with some embodiments. It is understood that additional operations may be performed before, during, and/or after the method 500 depicted in FIG. 5, and that some other operations may only be briefly described herein. In some embodiments, other implementations are within the scope of the disclosure.

In operation 510, the signal counting circuits 210 and 220 generate corresponding maximum counter values COUNT_A and COUNTB by performing counting operations based on the reference signal Fref and the pre-scaled feedback signal Fdiv, respectively. The pre-scaled feedback signal Fdiv is generated by dividing a synthesized oscillating signal Fout by a prescaler 118, and the synthesized oscillating signal Fout is generated in relation to the reference signal Fref.

In operation 520, the signal counting circuits 210 and 220 or the lock signal generator 230 determines if the maximum counter value COUNT_A from the signal counting circuit 210 equals a predetermined cycle value. The predetermined cycle value could be hard-wired in the signal counting circuit 210 or the lock signal generator 230, stored in a storage unit accessible to the signal counting circuit 210 or the lock signal generator 230, or the counter 212 of the signal counting circuit 210 is configured to overflow after a counter value of the counter 212 reaches the predetermined cycle value. In some embodiments, the predetermined cycle value is 4, 8, 16, or 20.

If the maximum counter value COUNT_A from the signal counting circuit 210 equals the predetermined cycle value in operation 520, which defines an observation period, the process moves on to operation 525, where the counters 212 and 222 are reset. Otherwise, the process goes back to operation 510 for continuing determining the maximum counter values COUNT_A and COUNT_B by counting the rising edges and/or falling edges of the reference signal Fref and the pre-scaled feedback signal Fdiv. In some embodiments, the reset of the counters 212 and 222 in operation 525 is performed at a different stage, and the process goes directly from operation 520 to operation 530. Please explain the dashed box In operation 530, a comparison unit 410 compares the maximum counter values COUNT_A and COUNT_B, which are generated based on the reference signal Fref and the pre-scaled feedback signal Fdiv, respectively. Then, an equal or an unequal event is generated according to the comparison result. In at least one embodiment, after the comparison, the maximum counter values COUNT_A and COUNT_B and/or the counters 212 222 are reset.

In at least one embodiment, the maximum counter value COUNT_A from the signal counting circuit 210 at this stage is equal to the predetermined cycle value. If the maximum counter values COUNT_A and COUNT_B are unequal, the process moves on to operation 540, where the equal event counter value is reset. After operation 540, the process foes back to operation 510. If the maximum counter values COUNT_A and COUNT_B are equal, the process moves on to operation 540, where a counter 422 is used to generate an equal event counter value, and the equal event counter value is increased by one every time it is determined by comparison unit 410 that the maximum counter values COUNT_A and COUNT_B are equal.

In operation 560, the equal event counter value is compared with a predetermined threshold counter value. If the equal event counter value and the predetermined threshold counter value are equal, the process moves on to operation 570, where a lock signal generator 424 generates a lock signal after the counter value equals a predetermined threshold counter value. In some embodiments, the predetermined threshold counter value is 10. Then the process moves back to operation 510. On the other hand, if the equal event counter value and the predetermined threshold counter value are not equal, the process moves back to operation 510 without resetting the equal event counter value.

In at least one embodiment, the maximum counter values COUNT_A and COUNT_B are reset at a stage prior to operation 560. In some embodiments, the reset of the maximum counter values COUNT_A and COUNT_B and the reset of the counters 212 and 214 in operation 525 are performed at the same stage of the method 500 after operation 530.

In accordance with one embodiment, a lock detector for a PLL circuit includes a first signal counting circuit, a second signal counting circuit, a comparator, and a lock status unit. The first signal counting circuit is configured to define a plurality of observation periods according to a first oscillating signal and a predetermined cycle value. The second signal counting circuit is configured to determine a maximum counter value according to a second oscillating signal within each of the observation periods, and the second oscillating signal is generated in relation to the first oscillating signal. The comparator is configured to determine, for each of the observation periods, whether the maximum counter value equals the predetermined cycle value. The lock status unit is configured to generate a lock signal based on the maximum counter value being equal to the predetermined cycle value for a predetermined number of consecutive ones of the observation periods.

In accordance with another embodiment, a lock detector for a PLL circuit includes a lock signal generator, a first counter, a first maximum detector, a second counter, and a second maximum detector. The lock signal generator is configured to generate a lock signal according to a relationship between a first maximum value and a second maximum value. The first counter is configured to generate a counter value in response to a first oscillating signal. The first maximum detector is coupled between the first counter and the lock signal generator and configured to determine the first maximum value of the counter value from the first counter. The second counter is configured to generate a counter value in response to a second oscillating signal generated in relation to the first oscillating signal. The second maximum detector is coupled between the second counter and the lock signal generator and configured to determine the second maximum value of the counter value from the second counter.

In accordance with yet another embodiment, a method of detecting a lock status of a PLL circuit includes the following operations. A first maximum value is generated by performing a counting operation based on a first oscillating signal, and a second maximum value is generated by performing a counting operation based on a second oscillating signal generated by the PLL circuit relative to the first oscillating signal. An equal event or an unequal event is generated by comparing the first maximum value and the second maximum value. An equal event counter value is generated by a counter in response to the equal event. Then, a lock signal is generated after the equal event counter value is equal to a predetermined counter threshold value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lock detector for a Phase Lock Loop (PLL) circuit comprising:
    a first signal counting circuit configured to define a plurality of observation periods according to a first oscillating signal and a predetermined cycle value;
    a second signal counting circuit configured to determine a maximum counter value according to a second oscillating signal within each of the observation periods, the second oscillating signal being generated in relation to the first oscillating signal;
    a comparator configured to determine, for each of the observation periods, whether the maximum counter value equals the predetermined cycle value; and
    a lock status unit configured to generate a lock signal based on the maximum counter value being equal to the predetermined cycle value for a predetermined number of consecutive ones of the observation periods.

2. The lock detector of claim 1, wherein the predetermined cycle value is 4, 8, 16, or 20.

3. The lock detector of claim 1, wherein the predetermined number is 10.

4. The lock detector of claim 1, wherein each of the observation periods is defined by a count of the occurrence of a rising or a falling edge of the first oscillating signal and a determination that a counted number of the occurrence of a rising or a falling edge of the first oscillating signal is equal to or greater than the predetermined cycle value.

5. The lock detector of claim 4, wherein the first signal counting circuit comprises a counter and a maximum detector connected to the counter, and the counter is configured to:
    generate the counted number of the occurrence of a rising or a falling edge of the first oscillating signal; and
    overflow after the counted number is equal to the predetermined cycle value.

6. The lock detector of claim 5, wherein the second signal counting circuit is configured to be reset by the first signal counting circuit in response to the overflow of the counter of the first signal counting circuit.

7. The lock detector of claim 4, wherein the second signal counting circuit is configured to be reset by the comparator after the counted number of the occurrence of a rising or a falling edge of the first oscillating signal is equal to or greater than the predetermined cycle value.

8. A lock detector for a Phase Lock Loop (PLL) circuit comprising:
    a lock signal generator configured to generate a lock signal according to a relationship between a first maximum value and a second maximum value;
    a first counter configured to generate a counter value in response to a first oscillating signal;
    a first maximum detector coupled between the first counter and the lock signal generator and configured to determine the first maximum value of the counter value from the first counter;
    a second counter configured to generate a counter value in response to a second oscillating signal generated in relation to the first oscillating signal; and
    a second maximum detector coupled between the second counter and the lock signal generator and configured to determine the second maximum value of the counter value from the second counter.

9. The lock detector of claim 8, wherein the lock signal generator comprises:
    a comparator configured to generate an equal event or an unequal event by comparing the first maximum value and the second maximum value.

10. The lock detector of claim 9, wherein the lock signal generator further comprises:
    a third counter configured to generate an equal event counter value in response to the equal event from the comparator; and
    a lock status unit configured to generate the lock signal after the equal event counter value from the third counter equals a predetermined counter threshold value.

11. The lock detector of claim 10, wherein the third counter is configured to be reset after the generation of the lock signal or the generation of the unequal event.

12. The lock detector of claim 10, wherein the predetermined threshold counter value is 10.

13. The lock detector of claim 8, wherein the first and second counters are configured to be reset after the counter value of the first counter is equal to a predetermined cycle value.

14. The lock detector of claim 13, wherein the first counter is configured to overflow after the counter value of the first counter is equal to the predetermined cycle value, and the second counter is reset in response to an occurrence of overflow of the first counter.

15. The lock detector of claim 13, wherein the predetermined cycle value is 4, 8, 16, or 20.

16. A method of detecting a lock status of a Phase Lock Loop (PLL) circuit, the method comprising:
generating a first maximum value by performing a counting operation based on a first oscillating signal;
generating a second maximum value by performing a counting operation based on a second oscillating signal generated by the PLL circuit relative to the first oscillating signal;
generating an equal event or an unequal event by comparing the first maximum value and the second maximum value;
generating an equal event counter value, by a counter, in response to the equal event; and
generating a lock signal after the equal event counter value equals a predetermined counter threshold value.

17. The method of claim 16, further comprising:
resetting the first and second maximum values after the first maximum value equals a predetermined cycle value.

18. The method of claim 17, wherein the predetermined cycle value is 4, 8, 16, or 20.

19. The method of claim 16, wherein the predetermined threshold counter value is 10.

20. The method of claim 16, further comprising:
resetting the equal event counter value after the generation of the lock signal or the generation of the unequal event.

* * * * *